(12) United States Patent
Kozuma

(10) Patent No.: US 11,374,566 B2
(45) Date of Patent: Jun. 28, 2022

(54) MOTION DETECTION DEVICE

(71) Applicant: HONDA LOCK MFG. CO., LTD., Miyazaki (JP)

(72) Inventor: Hiroyuki Kozuma, Miyazaki (JP)

(73) Assignee: Honda Lock Mfg. Co., Ltd., Miyzaki (JP)

( * ) Notice: Subject to any disclaimer, the term of this patent is extended or adjusted under 35 U.S.C. 154(b) by 0 days.

(21) Appl. No.: 17/145,672

(22) Filed: Jan. 11, 2021

(65) Prior Publication Data
US 2021/0320655 A1    Oct. 14, 2021

(30) Foreign Application Priority Data

Apr. 8, 2020  (JP) .............................. JP2020-069903

(51) Int. Cl.
*H03K 17/955* (2006.01)
*E05F 15/73* (2015.01)

(52) U.S. Cl.
CPC ........... *H03K 17/955* (2013.01); *E05F 15/73* (2015.01); *E05Y 2400/858* (2013.01); *E05Y 2900/546* (2013.01)

(58) Field of Classification Search
CPC . H03K 17/955; E05F 15/73; E05Y 2400/858; E05Y 2900/546
See application file for complete search history.

(56) References Cited

U.S. PATENT DOCUMENTS

| | | | |
|---|---|---|---|
| 10,669,767 B2 | 6/2020 | Nihei et al. | |
| 2008/0122456 A1* | 5/2008 | Moon | H03K 17/955 324/674 |
| 2012/0123649 A1* | 5/2012 | Eggers | E05F 15/76 701/49 |
| 2020/0223374 A1* | 7/2020 | Kondo | B60R 11/0264 |

FOREIGN PATENT DOCUMENTS

| | | | | |
|---|---|---|---|---|
| JP | 2018-044329 A | | 3/2018 | |
| WO | WO-2012098027 A1 | * | 7/2012 | ........... H03K 17/955 |

* cited by examiner

*Primary Examiner* — Nabil H Syed
*Assistant Examiner* — Cal J Eustaquio
(74) *Attorney, Agent, or Firm* — Carrier Blackman & Associates, P.C.; William D. Blackman; Joseph P. Carrier

(57) ABSTRACT

A motion detection device includes an attached member on a vehicle body side, a sensor electrode configured to detect capacitance, and a sensor bracket. The sensor bracket has a sensor holding portion holding the sensor electrode and is attached to an inner surface of the attached member. The sensor holding portion includes a holding piece that extends from a side away from an inner surface of the attached member to a side approaching the inner surface and holds the sensor electrode, and the holding piece holds the sensor electrode at a position at which an axis of the sensor electrode is separated from the inner surface of the attached member by at least 15 mm or more.

18 Claims, 5 Drawing Sheets

MOTION DETECTION DEVICE

CROSS-REFERENCE TO RELATED APPLICATION

Priority is claimed on Japanese Patent Application No. 2020-069903, filed Apr. 8, 2020, the content of which is incorporated herein by reference.

BACKGROUND OF THE INVENTION

Field of the Invention

The present invention relates to a motion detection device that detects a motion of a person with a capacitive sensor electrode.

Description of Related Art

As a technology of an opening and closing portion of a vehicle such as a tailgate, a device that detects a kicking motion of a person and causes the opening and closing portion to perform an opening and closing motion is known (for example, refer to Japanese Unexamined Patent Application, First Publication No. 2018-44329). In this technology, a motion detection device equipped with a capacitive sensor electrode as a sensor that detects a motion of a person is used.

In this type of motion detection device, a plurality of sensor electrodes for detecting changes in capacitance are attached to a member attached to a vehicle body side such as a rear bumper via sensor brackets. The plurality of sensor electrodes are connected to a control unit for determining the motion of a person such as a kicking motion on the basis of the detected changes in capacitance.

SUMMARY OF THE INVENTION

In a conventional motion detection device, a plurality of sensor electrodes are disposed vertically spaced apart and the motion of a person and what is otherwise noise (for example, a noise caused by a movement of a small animal and a noise caused by water that has entered inside the attached member) are distinguished therebetween on the basis of the changes in capacitance, detected by the plurality of sensor electrodes. However, for example, when a sufficient width of separation between the plurality of sensor electrodes cannot be secured due to restrictions on the shape or size of the attached member such as a bumper, the detection accuracy (resolution) of the capacitance of each sensor electrode needs to be improved, and a small amount of water that has entered inside the attached member is easily detected as noise.

Aspects according to the present invention have been made in consideration of the circumstances described above, and an object thereof is to provide a motion detection device capable of suppressing noise from being detected by a sensor electrode due to entry of water inside an attached member.

The present invention has adopted the following aspects to solve the problems described above.

(1): A motion detection device according to one aspect of the present invention is a motion detection device that is attached to a vehicle and detects a motion of a person near the vehicle, and includes a sensor electrode configured to detect capacitance, and a sensor bracket that has a sensor holding portion holding the sensor electrode and is attached to an inner surface of an attached member attached to a vehicle body, in which the sensor holding portion includes a holding piece that extends from a side away from the inner surface to a side near to the inner surface and holds the sensor electrode, and the holding piece holds the sensor electrode at a position at which an axis of the sensor electrode is separated from the inner surface by at least 15 mm or more.

According to the aspect of (1) described above, a sensor electrode held in a holding piece of a sensor bracket is separated from an inner surface of an attached member. For this reason, even if water that has entered an inside of the attached member flows along the inner surface of the attached member, the water is less likely to directly hit the sensor electrode. Since the holding piece of a sensor bracket extends from a side away from the inner surface of the attached member to a side approaching the inner surface, the water flowing along the inner surface of the attached member is less likely to go around the sensor electrode through the holding piece. Furthermore, in the motion detection device, since an axis of the sensor electrode is separated from the inner surface of the attached member by at least 15 mm or more, the water flowing along the inner surface of the attached member is less likely to be detected as large noise by the sensor electrode.

(2): In the aspect (1) described above, the sensor holding portion may include a support block portion that has a substantially lateral square U-shaped cross section opening toward the inner surface, and a pair of holding pieces extending from a top wall of the support block portion to a side close to the inner surface and sandwiching the sensor electrode.

According to the aspect (2) described above, since the sensor electrode sandwiched between the pair of holding pieces extends from the top wall of the support block portion to an inner surface side of the attached member, it is possible to more reliably suppress water flowing along the inner surface of the attached member from going around the sensor electrode.

(3): In the aspect of (2) described above, a through hole for draining off water may be formed in a part of an area in the vicinity of the support block portion.

According to the aspect of (3) described above, water that has flowed into the peripheral area of the support block portion can be discharged from the through hole to the inner surface side of the attached member. For this reason, it is possible to suppress water from remaining around an upper surface side of the support block portion, and water from going around the sensor electrode along the support block portion and the holding piece.

(4): In the aspect of (3) described above, the through hole for draining water may also be formed at a position above the support block portion.

According to the aspect of (4) described above, the water that has flowed into the area in the vicinity of the support block portion can be discharged to the inner surface side of the attached member above the support block portion. For this reason, it is possible to more reliably suppress the water from going around the sensor electrode along the support block portion and the holding piece.

(5): In any one of the aspects (2) to (4) described above, a drainage gap is secured at a position below the support block portion between inner surface and the sensor bracket.

According to the aspect of (5) described above, water flowing along the inner surface of the attached member is discharged to a side below the sensor bracket through the drainage gap below the support block portion. For this reason, it is possible to prevent water from staying in an area of the inner surface of the attached member, which faces the sensor electrode.

(6): In any one of the aspects (1) to (5) described above, the holding piece may be formed such that the held sensor electrode faces a portion of the inner surface, which is inclined with respect to a horizontal direction.

According to the aspect of (6) described above, even if the water that has entered the inside of the attached member flows into a position facing the sensor electrode along the inner surface, since this portion is inclined with respect to the horizontal direction, the water can be quickly discharged below the sensor electrode.

(7) In the aspect of (2) described above, the pair of holding pieces may also be formed such that a width of separation between each other narrows from a side away from the inner surface to a side approaching the inner surface.

According to the aspect of (7) described above, when the sensor electrode is attached to the holding pieces, the sensor electrode may be disposed at a position with a wide width of separation between the holding pieces, and the sensor electrode may be caused to slide to a position with a narrow width of separation between the holding pieces in this state. As a result, it is possible to easily attach the sensor electrode to the holding pieces.

(8): In the aspect of (7) described above, the attached member may be a bumper extending in a vehicle width direction, the sensor bracket may have a plurality of sensor holding portions disposed in an extending direction of the bumper, and the sensor electrode may be formed to be longest along the extending direction of the bumper and may be sandwiched between the holding pieces of the plurality of sensor holding portions.

According to the aspect of (8) described above, a long sensor electrode can be held in the plurality of sensor holding portions of the sensor bracket. When the sensor electrode is attached to the sensor bracket, the sensor electrode can be disposed at a position with a wide width of separation between the holding pieces of each sensor holding portion and the sensor electrode can be caused to slide to a position with a narrow width of separation between the holding pieces of each sensor holding portion in this state. As a result, it is possible to easily attach a long sensor electrode to the sensor bracket.

According to the aspects of the present invention, it is possible to suppress noise from being detected by a sensor electrode due to entry of water inside an attached member.

DETAILED DESCRIPTION OF THE INVENTION

Figure 1:
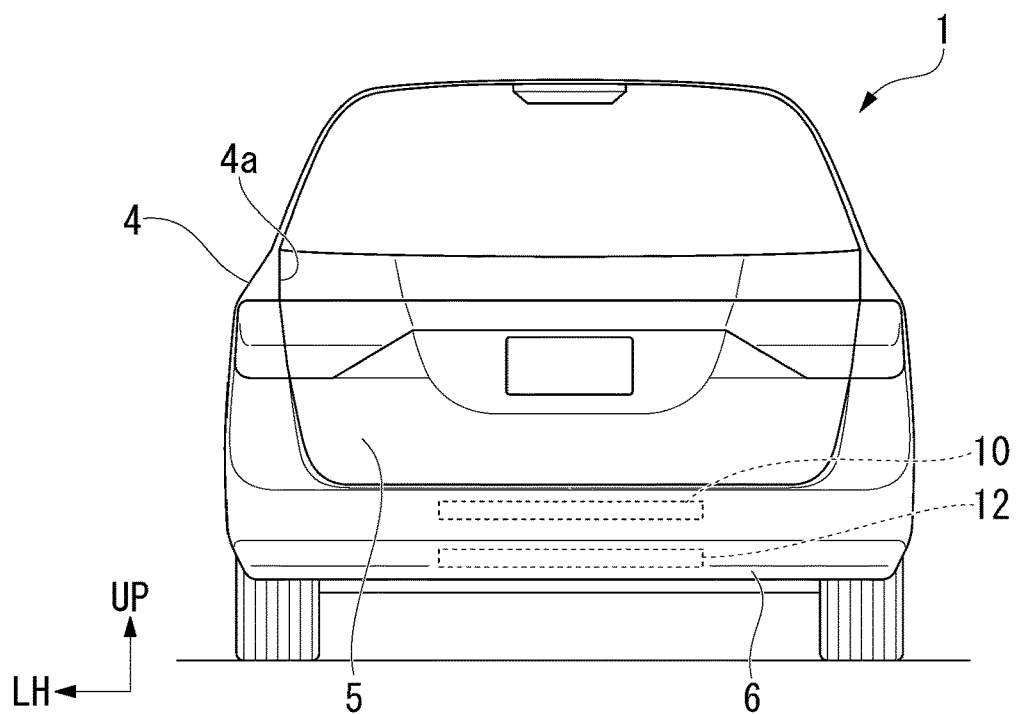
FIG. 1 is a rear view of a vehicle of embodiments.

Hereinafter, embodiments of the present invention will be described on the basis of the drawings. In each embodiment, common parts are denoted by the same reference numerals, and duplicated description thereof will be omitted.

Figure 2:
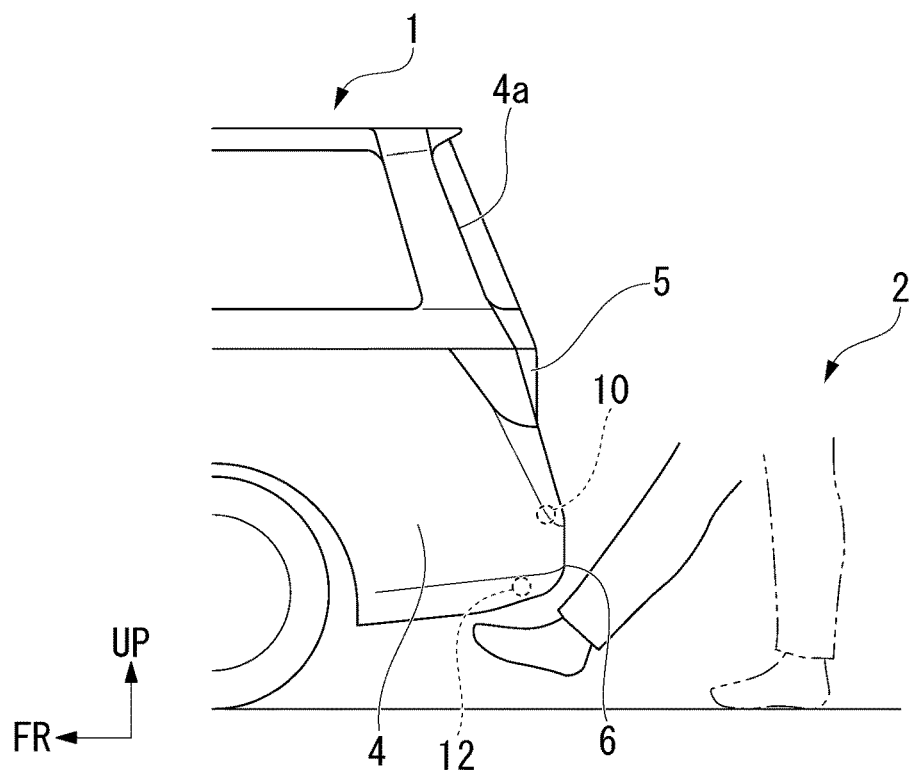
FIG. 2 is a side view of the vehicle of the embodiments.

FIG. 1 is a rear view of a vehicle 1 that has adopted a motion detection device according to an embodiment, and FIG. 2 is a left side view of a rear part of the vehicle 1. An arrow FR in FIGS. 1 and 2 points to the front of the vehicle 1, an arrow UP points to an upper side of the vehicle 1, and an arrow LH points to a left side of the vehicle 1.

In FIGS. 1 and 2, a reference numeral 4 is a vehicle main body part of the vehicle 1 having an opening 4a at the rear part, and a reference numeral 5 is a tailgate attached to the vehicle main body part 4 to open and close the opening 4a. A reference number 6 is a rear bumper attached to a position below the opening 4a at the rear part of the vehicle main body part 4, and a reference number 2 is a worker who opens and closes the tailgate 5 by a kicking motion (a motion in which a top of the foot is brought close to a specific area near the rear bumper 6).

In the present embodiment, the rear bumper 6 constitutes an attached member on a vehicle body side. An upper sensor electrode 10 and a lower sensor electrode 12 are attached to an inside of the rear bumper 6 via a sensor bracket 7 to be described below (refer to FIGS. 3 and 4). The upper sensor electrode 10, the lower sensor electrode 12, and the sensor bracket 7 constitute a main part of the motion detection device 3.

The upper sensor electrode 10 and the lower sensor electrode 12 are sensors that detect capacitance that changes according to an approach of an object. The upper sensor electrode 10 and the lower sensor electrode 12 are configured, for example, by coating a long metal wire with a resin.

Figure 3:
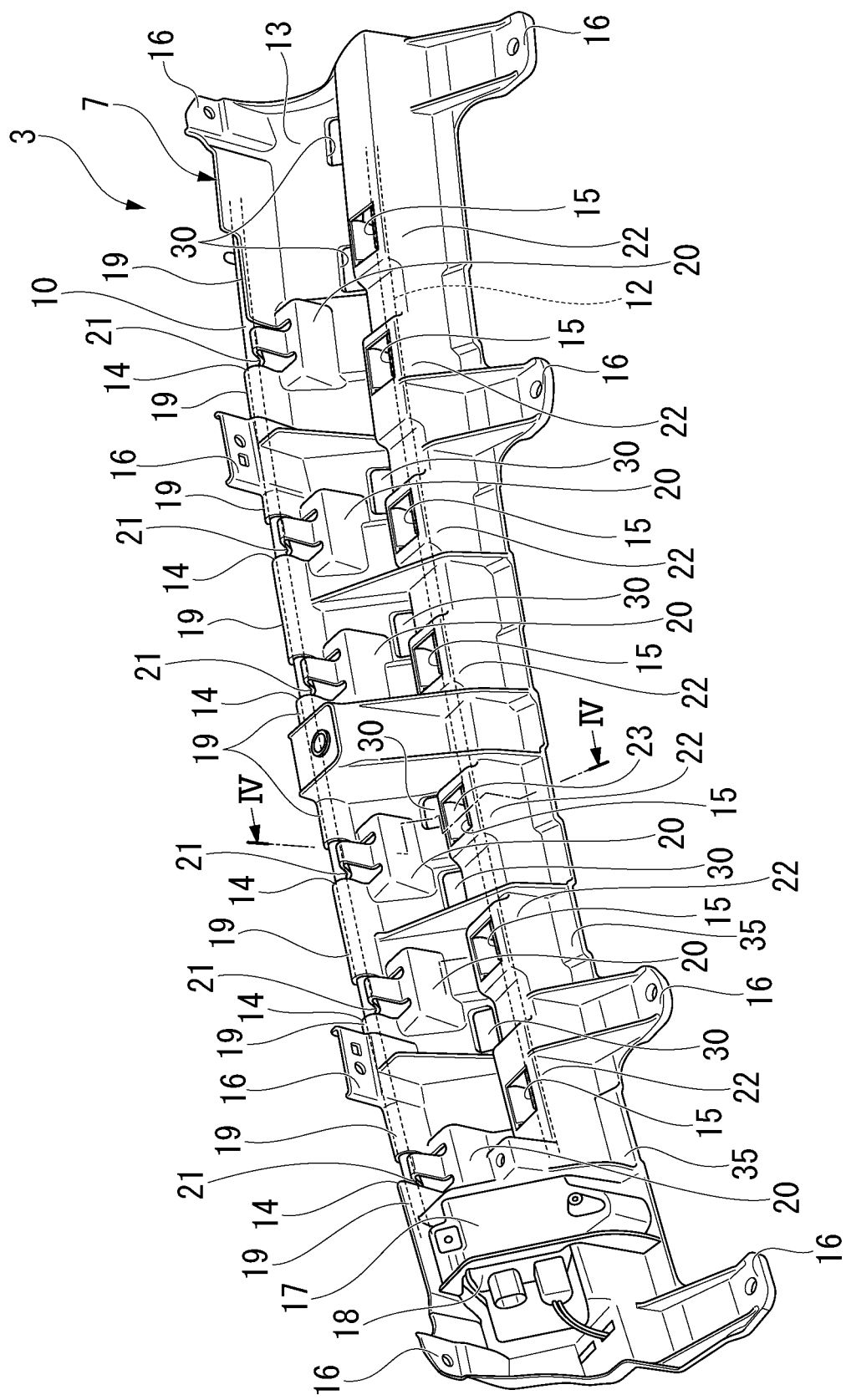
FIG. 3 is a perspective view of a motion detection device according to a first embodiment.
Figure 4:
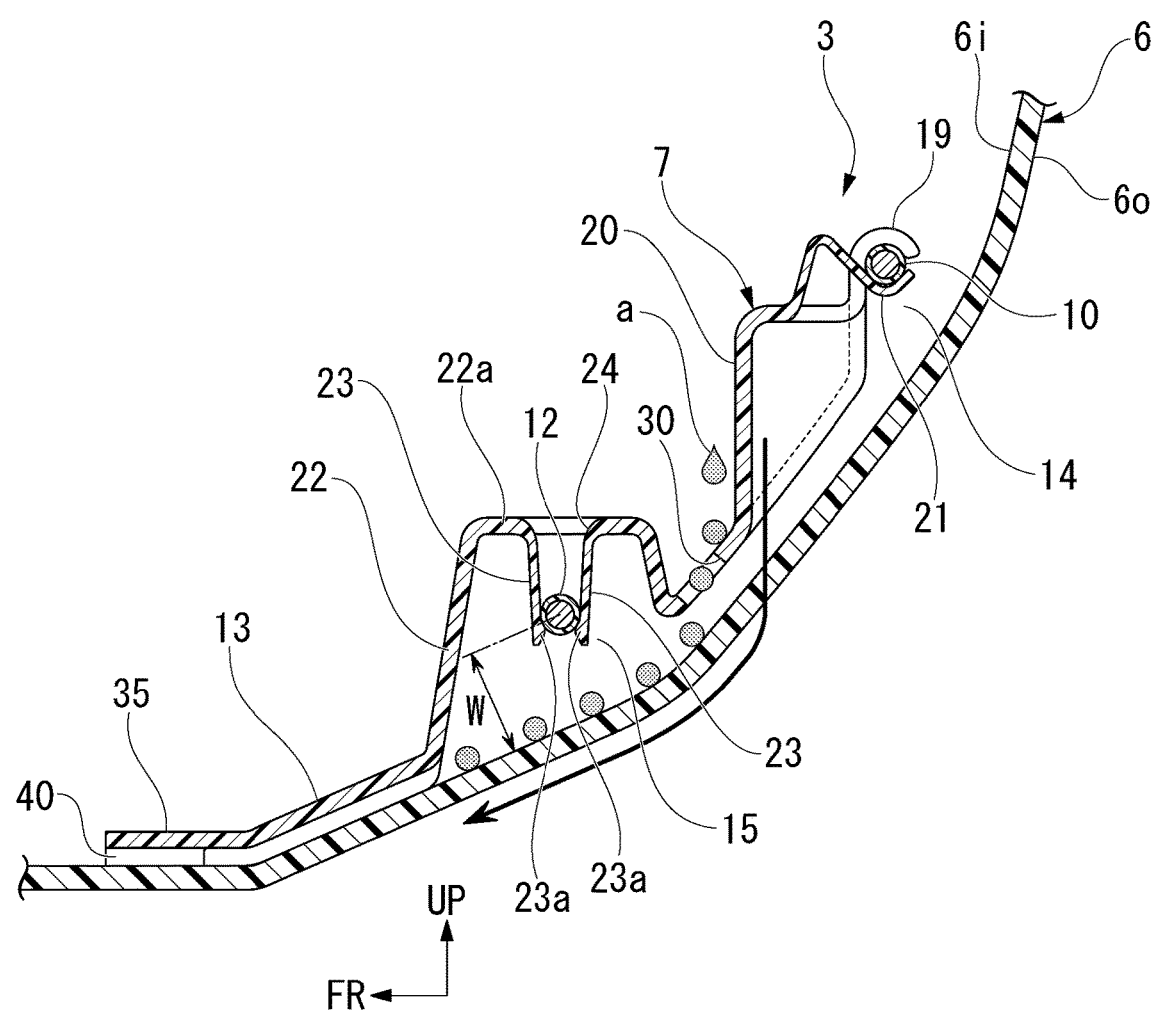
FIG. 4 is a cross-sectional view of a part of an attached member to which the motion detection device of the first embodiment is attached, which corresponds to an IV-IV cross section of FIG. 3.

FIG. 3 is a perspective view of the motion detection device 3 of the first embodiment attached inside the rear bumper 6. FIG. 4 is a cross-sectional view of the rear bumper 6 to which the motion detection device 3 is attached, which corresponds to a cross-section IV-IV in FIG. 3.

The rear bumper 6 extends substantially horizontally from one end side to the other end side in a vehicle width direction below the opening 4a of the vehicle main body part 4. An outer surface 6o of the rear bumper 6 facing rearward in the vehicle and an inner surface 6i facing forward in vehicle are formed to smoothly curve forward from an upper side to a lower side.

The sensor bracket 7 is attached to a central area of the inner surface 6i of the rear bumper 6 in the vehicle width direction to be along the extending direction (a direction along the vehicle width direction) of the rear bumper 6.

A main portion of the sensor bracket 7 is configured by a long resin block in a direction along the extending direction of the rear bumper 6. The sensor bracket 7 includes a base portion 13 curved in a vertical direction to substantially follow the inner surface 6i of the rear bumper 6, a plurality of upper sensor holding portions 14 formed in a longitudinal direction in a part near a upper end of the base portion 13, and a plurality of lower sensor holding portions 15 formed in a longitudinal direction in a part near a lower end of the base portion 13. The upper sensor electrode 10 is attached to the plurality of upper sensor holding portions 14, and the lower sensor electrode 12 is attached to the plurality of lower sensor holding portions 15. Mounting pieces 16 extend at a plurality of places separated in a longitudinal direction of a lower edge portion and an upper edge portion of the sensor bracket 7. Each of the mounting pieces 16 is fixed to the rear bumper 6 by bolt fastening or the like at a vehicle body mounting portion of the rear bumper 6.

The unit holding portion 17 is formed on one end side of the sensor bracket 7 in the longitudinal direction. The control unit 18 that receives a detection signal from the upper sensor electrode 10 and the lower sensor electrode 12 and processes the signal is attached to the unit holding portion 17. The control unit 18 receives the detection signal and determines whether a kicking motion by a person has been performed in a vicinity of a rear lower part of the rear bumper 6. The signal processed by the control unit 18 is output to an integrated controller (not shown). The integrated controller outputs the signal to an unlocking device and an actuator (not shown) and causes the tailgate 5 to open on the basis of the determination of a kicking motion.

The upper sensor holding portion 14 includes an upper locking claw 19 that extends upward from the part near the upper end of the base portion 13, and curves in an arc shape from the upper end portion toward a lower part of a vehicle rear part, a raised block 20 that is raised upward in a box shape from the part near the upper end of the base portion 13, and a lower locking claw 21 that bends and extends in a substantially Z shape from the raised block 20 toward an upper part of the vehicle rear part. The raised block 20 and the lower locking claw 21 are disposed between two upper locking claws 19 in a longitudinal direction (a vehicle width direction) of the sensor bracket 7. The upper locking claw 19 and the lower locking claw 21 are disposed alternately side by side in the longitudinal direction of the sensor bracket 7.

The lower locking claw 21 and an adjacent upper locking claw 19 vertically sandwich the upper sensor electrode 10, thereby fixing (holding) the upper sensor electrode 10. The lower locking claw 21 supports the upper sensor electrode 10 from below, and the upper locking claw 19 supports the upper sensor electrode 10 from above. The upper sensor electrode 10 is held at a plurality of places in the longitudinal direction by the plurality of upper sensor holding portion 14 (the lower locking claw 21 and the upper locking claw 19) in the part near the upper end of the sensor bracket 7.

The lower sensor holding portion 15 includes a support block portion 22 that is raised upward from a part near a lower end of the base portion 13, and a pair of holding pieces 23 that extend downward from the top wall 22a of the support block portion 22. The support block portion 22 has a cross section formed, as shown in FIG. 4, in a substantially lateral square-U-shape in which a cross section along a front to rear direction of the vehicle opens downward (toward the inner surface 6i of the rear bumper 6). A slit 24 that extends in the longitudinal direction (the vehicle width direction) of the sensor bracket 7 is formed at substantially the center of the top wall 22a of the support block portion 22. The pair of holding pieces 23 extend downward from front to rear edges of the slit 24 of the top wall 22a (toward a side approaching to the inner surface 6i of the rear bumper 6). The pair of holding pieces 23 are formed such that the width of separation from each other narrows from the top wall 22a side (a side away from the inner surface 6i) of the support block portion 22 toward a lower part (the side approaching the inner surface 6i). The lower sensor electrode 12 is sandwiched between the pair of holding pieces 23. A locking projection 23a is formed on surfaces of the pair of holding pieces 23 that face each other on an extending end side. The lower sensor electrode 12 is sandwiched by the pair of holding pieces 23 in a state of being locked by the locking projection 23a on the extending end side of the holding pieces 23.

Here, the pair of holding pieces 23 hold the lower sensor electrode 12 at a position at which a separation distance W from an axis of the lower sensor electrode 12 to the inner surface 6i of the rear bumper 6 is 15 mm or more. The lower sensor electrode 12 held by the pair of holding pieces 23 of the lower sensor holding portion 15 is separated from the inner surface 6i of the rear bumper 6 by a predetermined gap. The separation distance between the upper sensor electrode 10 and the lower sensor electrode 12 is within a range of 50 mm to 80 mm due to restrictions on the shape and size of the rear bumper 6. When the separation distance between sensor electrodes is within this range, if the separation distance W from the axis of the lower sensor electrode 12 to the inner surface 6i of the rear bumper 6 is set to 15 mm or more, the water a flowing through the inner surface 6i of the rear bumper 6 is less likely to be detected as a noise by each sensor electrode.

The pair of holding pieces 23 are formed such that the held lower sensor electrode 12 faces a portion of the inner surface 6i of the rear bumper 6 that is inclined with respect to the horizontal direction.

The through hole 30 for draining water that passes through the base portion 13 of the sensor bracket 7 in the vertical direction is formed at a position of an area in the vicinity of each support block portion 22 of the sensor bracket 7, which is on a side above the support block portion 22. When the water a that has entered the inside of the rear bumper 6 flows into an upper surface side of the sensor bracket 7, this through hole 30 allows the water a to flow out to the lower side of the sensor bracket 7 (the inner surface 6i side of the rear bumper 6) before the water a is blocked by a wall of the support block portion 22.

At a lower edge of the sensor bracket 7, a raised portion 35 for forming the drainage gap 40 between itself and the inner surface 6i of the rear bumper 6 is formed. The drainage gap 40 formed by the raised portion 35 discharges the water a that has flowed into a lower part of the lower sensor holding portion 15 (the support block portion 22) to a side of the sensor bracket 7 (of the inner surface 6i of the rear bumper 6), which is lower than a disposition part.

As described above, the motion detection device 3 of the present embodiment has a holding piece 23 in which the lower sensor holding portion 15 of the sensor bracket 7 extends from the side away from the inner surface 6i of the rear bumper 6 to the side approaching the inner surface 6i, and the lower sensor electrode 12 is held to be separated from the inner surface 6i on the extending end side of this holding piece 23. For this reason, even if the water a that has entered the inside of the rear bumper 6 flows along the inner surface 6i of the rear bumper 6, the water a is less likely to directly hit the lower sensor electrode 12. Since the holding piece 23 extends from the side away from the inner surface 6i of the rear bumper 6 to the side approaching the inner surface 6i, the water a flowing along the inner surface 6i of the rear bumper 6 is less likely to go around the lower sensor electrode 12 through the holding piece 23.

Furthermore, in the motion detection device 3 of the present embodiment, the holding piece 23 of the sensor bracket 7 holds the lower sensor electrode 12 at a position at which the axis of the lower sensor electrode 12 is separated from the inner surface 6i of the rear bumper 6 by at least 15 mm or more. For this reason, the water a flowing along the inner surface 6i of the rear bumper 6 is less likely to be detected as a large noise by the lower sensor electrode 12.

In the motion detection device 3 of the present embodiment, the upper sensor holding portion 14 includes a support block portion 22 with a substantially lateral square-U-shaped cross section and the pair of holding pieces 23 that extend from the top wall 22a of the support block portion 22 to the side approaching the inner surface 6i and sandwich the lower sensor electrode 12. For this reason, it is possible to more reliably suppress the water a flowing along the inner surface 6i of the rear bumper 6 from going around the lower sensor electrode 12.

Furthermore, in the motion detection device 3 of the present embodiment, a through hole 30 for draining water is formed at a part of an area in the vicinity of the support block portion 22. For this reason, the water a that has flowed into the area in the vicinity on an upper surface side of the support block portion 22 can be discharged to the inner surface 6i side of the rear bumper 6 through the through hole 30. Therefore, when this configuration is adopted, it is possible to suppress the water a from remaining around the upper surface side of the support block portion 22 or the water a from going around the lower sensor electrode 12 along the support block portion 22 and the holding piece 23.

In particular, in the motion detection device 3 of the present embodiment, since the through hole 30 for draining water is formed at a position above the support block portion 22, it is possible to more reliably suppress the water a from riding on the support block portion 22 and the water a from going around the lower sensor electrode 12 along the support block portion 22 and the holding piece 23.

In the motion detection device 3 of the present embodiment, the drainage gap 40 is secured between the inner surface 6i of the rear bumper 6 and the sensor bracket 7 at a position below the support block portion 22. For this reason, the water a flowing along the inner surface 6i of the rear bumper 6 is discharged to the lower side of the sensor bracket 7 through the drainage gap 40 on a side below the support block portion 22. Therefore, when this configuration is adopted, it is possible to prevent the water a from staying in an area of the inner surface 6i of the rear bumper 6, which faces the lower sensor electrode 12.

In the motion detection device 3 of the present embodiment, since the lower sensor electrode 12 faces an inclined part of the inner surface 6i of the rear bumper 6, even if the water a flows below the lower sensor electrode 12 along the inner surface 6i of the rear bumper 6, the water a can be quickly discharged below the lower sensor electrode 12 due to the inclination of the inner surface 6i.

Furthermore, the motion detection device 3 of the present embodiment is formed such that the width of separation between the pair of holding pieces 23 narrows from the side away from the inner surface 6i of the rear bumper 6 to the side approaching the inner surface 6i. For this reason, when the lower sensor electrode 12 is attached to the pair of holding pieces 23, it is possible to easily attach the lower sensor electrode 12 to the holding pieces 23 by disposing the lower sensor electrode 12 at a position with a wide width of separation between the pair of holding pieces 23 and causing the lower sensor electrode 12 to slide to a position with a narrow width of separation between the holding pieces 23 in this state.

In the motion detection device 3 of the present embodiment, a plurality of lower sensor holding portions 15 are disposed in the sensor bracket 7 in the extending direction of the rear bumper 6, and a long lower sensor electrode 12 is sandwiched by a pair of holding pieces 23 of the plurality of sensor holding portions 15. For this reason, the long lower sensor electrode 12 can be stably held at a plurality of places of the sensor bracket 7. When the lower sensor electrode 12 is attached to the sensor bracket 7, the lower sensor electrode 12 is disposed at a position of the lower sensor holding portion 15 with a wide width of separation between the holding pieces 23, and the long lower sensor electrode 12 can be easily attached to the sensor bracket 7 by causing the lower sensor electrode 12 to slide at a position of each lower sensor holding portion 15 with a narrow width of separation between the holding pieces 23.

Figure 5:
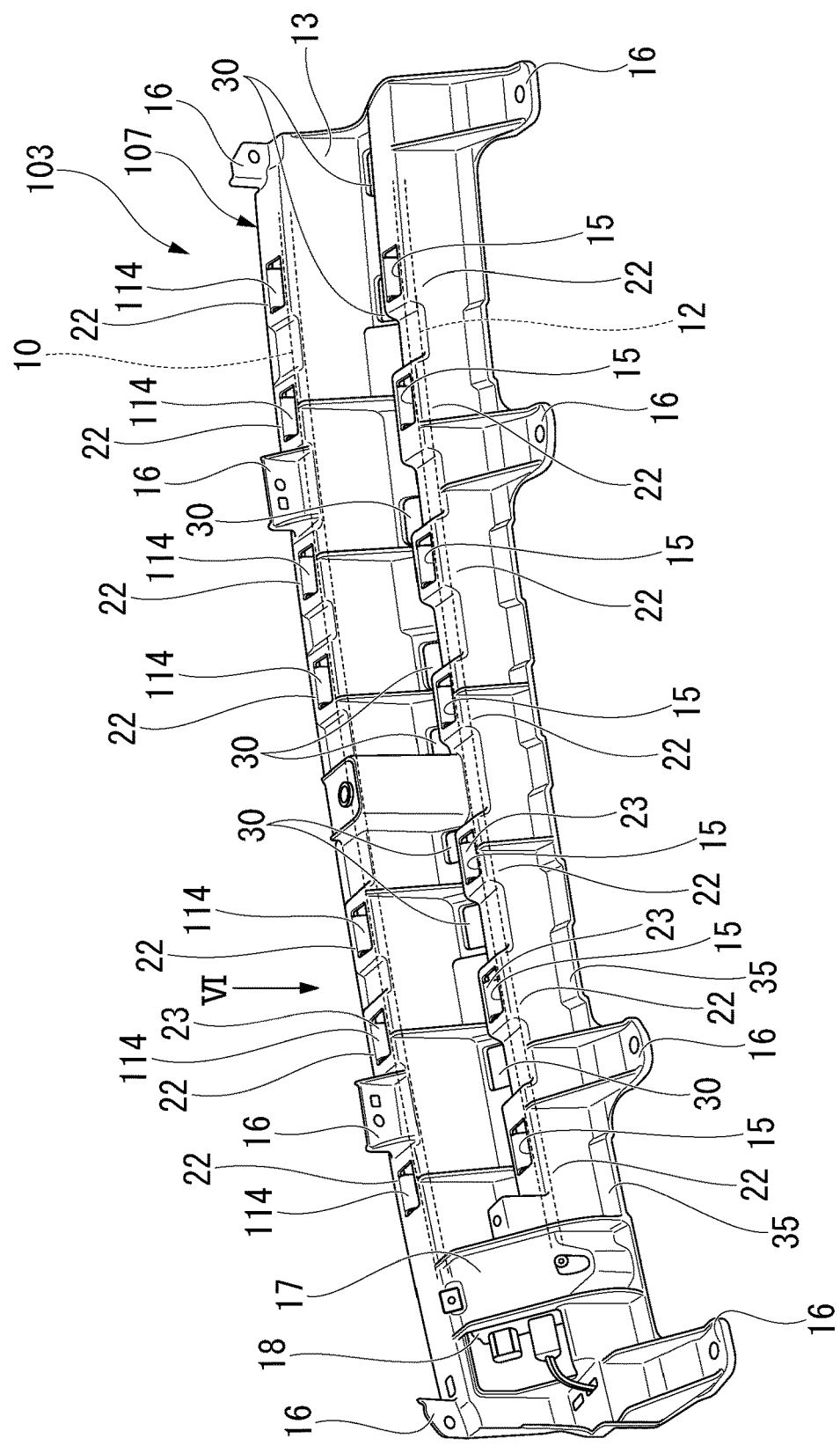
FIG. 5 is a perspective view of a motion detection device of a second embodiment.
Figure 6:
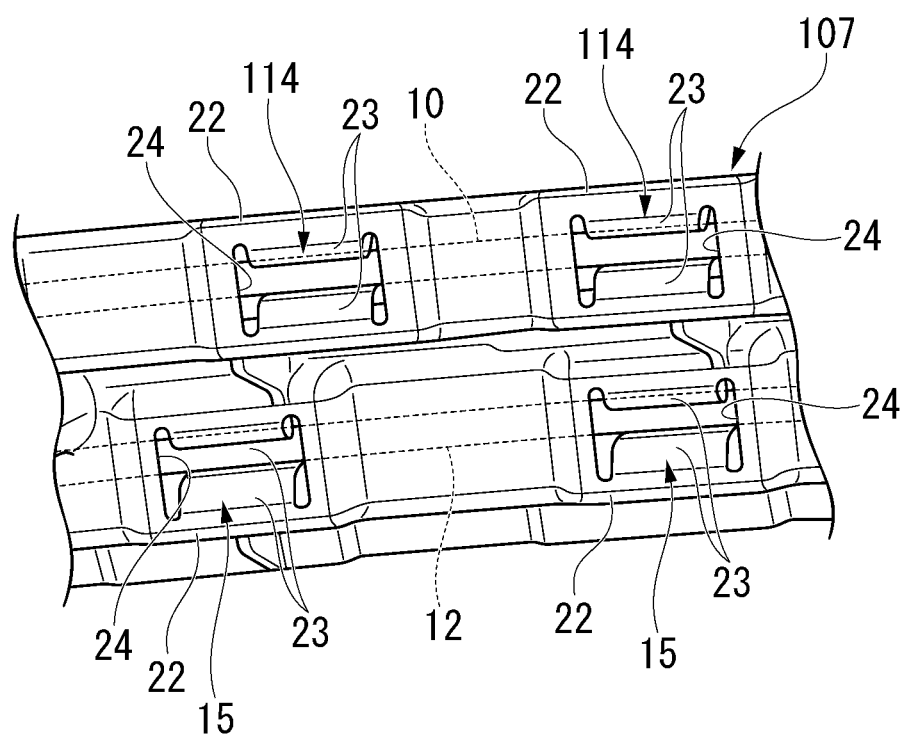
FIG. 6 is a VI arrow view of FIG. 5.

FIG. 5 is a perspective view of a motion detection device 103 of a second embodiment, and FIG. 6 is a VI arrow view of FIG. 5.

The motion detection device 103 of the second embodiment has a basic configuration substantially the same as in the first embodiment, but a configuration of an upper sensor holding portion 114 of the sensor bracket 107 is different from that of the first embodiment.

The upper sensor holding portion 114 of the sensor bracket 107 adopts substantially the same configuration as that of the lower sensor holding portion 15. That is, the upper sensor holding portion 114 includes a support block portion 22 that rises upward from a part near the upper end of the base portion 13, and a pair of holding pieces 23 extending downward from the top wall of the support block portion 22. In the support block portion 22, a cross section in a vehicle front to rear direction is formed to be a substantially lateral square-U-shaped cross section that opens downward and a slit 24 is formed in a substantially center of the top wall. The slit 24 extends in a direction along a longitudinal direction of the sensor bracket 107. Then, the pair of holding pieces 23 extend downward from front and rear edges of the slit 24 of the top wall, and sandwich the upper sensor electrode 10 on an extending end side.

Since the motion detection device 103 of the present embodiment has the same basic configuration as that of the first embodiment, it is possible to obtain substantially the same basic effect as that of the first embodiment. However, since the upper sensor holding portion 114 has substantially the same configuration as that of the lower sensor holding portion 15 in the motion detection device 103 of the present embodiment, there is an advantage that the upper sensor electrode 10 can be easily attached to the upper sensor holding portion 114.

The present invention is not limited to the embodiments described above, and various design changes can be made within a range not departing from the gist thereof.

For example, a sensor electrode is attached to a rear bumper that is an attached member via a sensor bracket in the embodiments described above, but an attached portion (the attached member) of the sensor electrode is not limited to a rear bumper, and may be a front bumper, a side sill, or the like. The use of the motion detection device is not limited to opening and closing a tailgate, and may be other purposes as long as the motion detection device is used to operate a device around a vehicle in a non-contact manner.

What is claimed is:

1. A motion detection device that is attached to a vehicle and that is configured to detect a motion of a person near the vehicle, said motion detection device comprising:
   a sensor electrode configured to detect capacitance; and
   a sensor bracket that has a sensor holding portion holding the sensor electrode and is attached to an inner surface of an attached member on a vehicle body, the sensor bracket including a base portion disposed proximate the inner surface, a support block portion having a first side wall which extends from said base portion in a direction away from the inner surface, a top wall which extends from said first side wall in a substantially horizontal direction, and a second side wall which extends from the top wall in a direction toward the inner surface,
   wherein the sensor holding portion includes a pair of spaced apart holding pieces, each of the holding pieces extending downwardly from an upper end attached to the top wall of the support block portion to a lower end which is spaced upwardly away from the inner surface, the holding pieces cooperating to hold the sensor electrode therebetween, and wherein the holding pieces hold the sensor electrode at a position at which an axis of the sensor electrode is spaced away and separated from the inner surface by at least 15 mm or more.

2. The motion detection device according to claim 1, wherein a through hole for draining water is formed in the sensor bracket at a part of an area thereof in the vicinity of the support block portion.

3. The motion detection device according to claim 2, wherein the through hole for draining water is formed at a position above the support block portion.

4. The motion detection device according to claim 1, wherein a drainage gap is secured at a position below the support block portion between the inner surface and the sensor bracket.

5. The motion detection device according to claim 1, wherein the holding pieces are formed such that the sensor electrode that has been held is disposed proximate a portion of the inner surface that is inclined with respect to a horizontal direction.

6. The motion detection device according to claim 1, wherein the pair of holding pieces are formed such that a width of separation from each other is narrowed from a side away from the inner surface to a side approaching the inner surface.

7. The motion detection device according to claim 6, wherein
the attached member is a bumper extending in a vehicle width direction,
the sensor bracket has a plurality of sensor holding portions disposed in an extending direction of the bumper, and
the sensor electrode is formed to be long in the extending direction of the bumper and is sandwiched between a pair of the holding pieces in each of the plurality of sensor holding portions.

8. The motion detection device according to claim 1, wherein said sensor electrode is a lower sensor electrode, and further comprising an upper sensor electrode which is held between an upper locking claw and a lower locking claw which is formed by an upper part of the sensor bracket.

9. The motion detection device according to claim 1, wherein each of the holding pieces is provided with a locking projection disposed proximate the lower end thereof, wherein the locking projections face toward one another and are disposed below the sensor electrode.

10. The motion detection device according to claim 1, wherein the base portion of the sensor bracket is spaced upwardly away from the inner surface to provide a drainage gap therebetween configured to permit water to flow outwardly therefrom.

11. A motion detection device that is attached to a vehicle and that is configured to detect a motion of a person near the vehicle, said motion detection device comprising:
a lower sensor electrode configured to detect capacitance; and
a sensor bracket that has a sensor holding portion holding the lower sensor electrode and is attached to an inner surface of an attached member on a vehicle body, the sensor bracket including a base portion disposed proximate the inner surface, a support block having a first side wall which extends from said base portion in a direction away from the inner surface, a top wall which extends from said first wall in a substantially horizontal direction, and a second side wall which extends from the top wall in a direction toward the inner surface,
wherein the sensor holding portion includes a pair of spaced apart holding pieces, each of the holding pieces extending downwardly from an upper end attached to the top wall of the support block portion to a lower end which is spaced upwardly away from the inner surface, the holding pieces cooperating to hold the lower sensor electrode therebetween,
wherein the holding pieces hold the lower sensor electrode at a position at which an axis thereof is spaced away and separated from the inner surface by at least 15 mm or more,
wherein a through hole for draining water is formed in the sensor bracket at an area thereof above the support block.

12. The motion detection device according to claim 11, wherein a drainage gap is secured at a position below the support block portion between the inner surface and the sensor bracket.

13. The motion detection device according to claim 11, wherein the holding pieces are formed such that the lower sensor electrode is disposed proximate a portion of the inner surface that is inclined with respect to a horizontal direction.

14. The motion detection device according to claim 11, wherein the pair of holding pieces are formed such that a width of separation from each other is narrowed from a side away from the inner surface to a side approaching the inner surface.

15. The motion detection device according to claim 11, wherein
the attached member is a bumper extending in a vehicle width direction,
the sensor bracket has a plurality of sensor holding portions disposed in an extending direction of the bumper, and
the sensor electrode is formed to be long in the extending direction of the bumper and is sandwiched between a pair of the holding pieces in each of the plurality of sensor holding portions.

16. The motion detection device according to claim 11, further comprising an upper sensor electrode which is held between an upper locking claw and a lower locking claw which is formed by an upper part of the sensor bracket.

17. The motion detection device according to claim 11, wherein each of the holding pieces is provided with a locking projection disposed proximate the lower end thereof, wherein the locking projections face toward one another and are disposed below the sensor electrode.

18. The motion detection device according to claim 11, wherein the base portion of the sensor bracket is spaced upwardly away from the inner surface to provide a drainage gap therebetween configured to permit water to flow outwardly therefrom.

* * * * *